United States Patent [19]
Hollowell

[11] Patent Number: 6,071,056
[45] Date of Patent: Jun. 6, 2000

[54] SHIPPING TRAY BACKSIDE LOCATION

[75] Inventor: John Philip Hollowell, Fremont, Calif.

[73] Assignee: International Business Machines Corporation, Armonk, N.Y.

[21] Appl. No.: 09/191,352

[22] Filed: Nov. 13, 1998

[51] Int. Cl.[7] .................................................. B65B 69/00
[52] U.S. Cl. ........................................ 414/405; 206/725
[58] Field of Search ................................... 414/405, 810; 206/725

[56] References Cited

U.S. PATENT DOCUMENTS

| | | | |
|---|---|---|---|
| 2,355,643 | 8/1944 | Grover | 414/405 |
| 3,191,791 | 6/1965 | Jackson | 206/725 |
| 3,518,752 | 7/1970 | Lentz | 414/405 X |
| 4,818,383 | 4/1989 | Wang | 414/405 X |
| 5,492,223 | 2/1996 | Boardman et al. | 206/725 X |
| 5,673,795 | 10/1997 | Clatanoff et al. | 206/725 X |
| 5,794,783 | 8/1998 | Carter | 206/725 |
| 5,848,702 | 12/1998 | Pakeriasamy | 206/725 |
| 5,890,599 | 4/1999 | Murphy | 206/725 |
| 5,957,293 | 9/1999 | Pakeriasamy | 206/725 |

FOREIGN PATENT DOCUMENTS

| | | | |
|---|---|---|---|
| 1537459 | 1/1990 | U.S.S.R. | 414/405 |

OTHER PUBLICATIONS

1990 Integrated Head Carrier (IBM Internal Disclosure).

*Primary Examiner*—James W. Keenan
*Attorney, Agent, or Firm*—Douglas R. Millett; Felsman, Bradley, Vaden, Gunter & Dillon, LLP

[57] ABSTRACT

A tray used during the processing and handling of HGAs has a set of locating and support features on both its top and bottom surfaces. Each tray has a perimeter which is designed to engage and be stacked above or below other ones of the trays. When the trays are stacked one on top of another, they nest so that the features on a top side of each of the trays do not interfere with the features on a bottom side of the adjacent trays. Thus, a stack of trays can be turned over and the HGAs that are located in the top sides will drop down and instantly be located in the bottom sides of the trays adjacent to them.

5 Claims, 5 Drawing Sheets

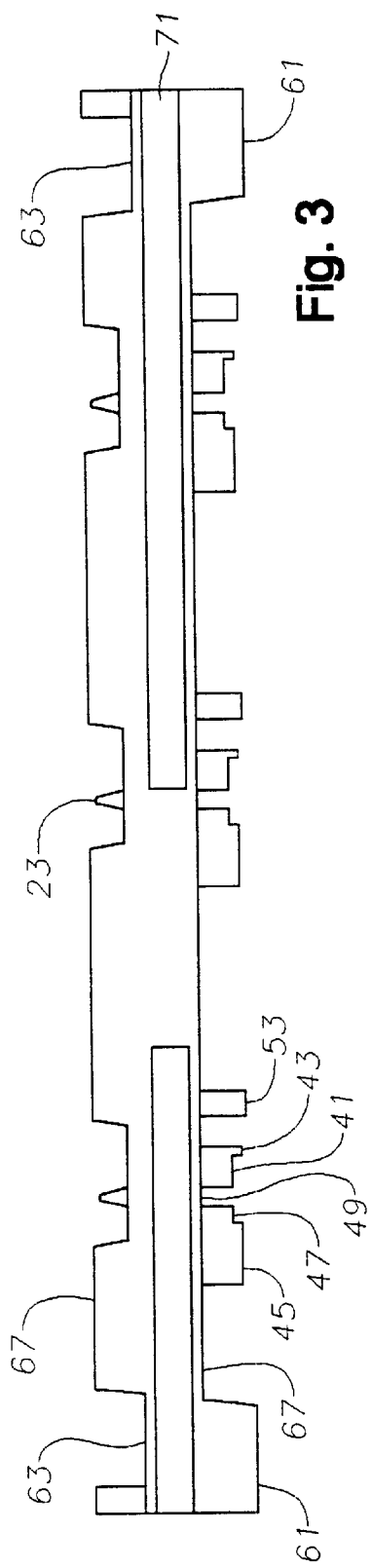
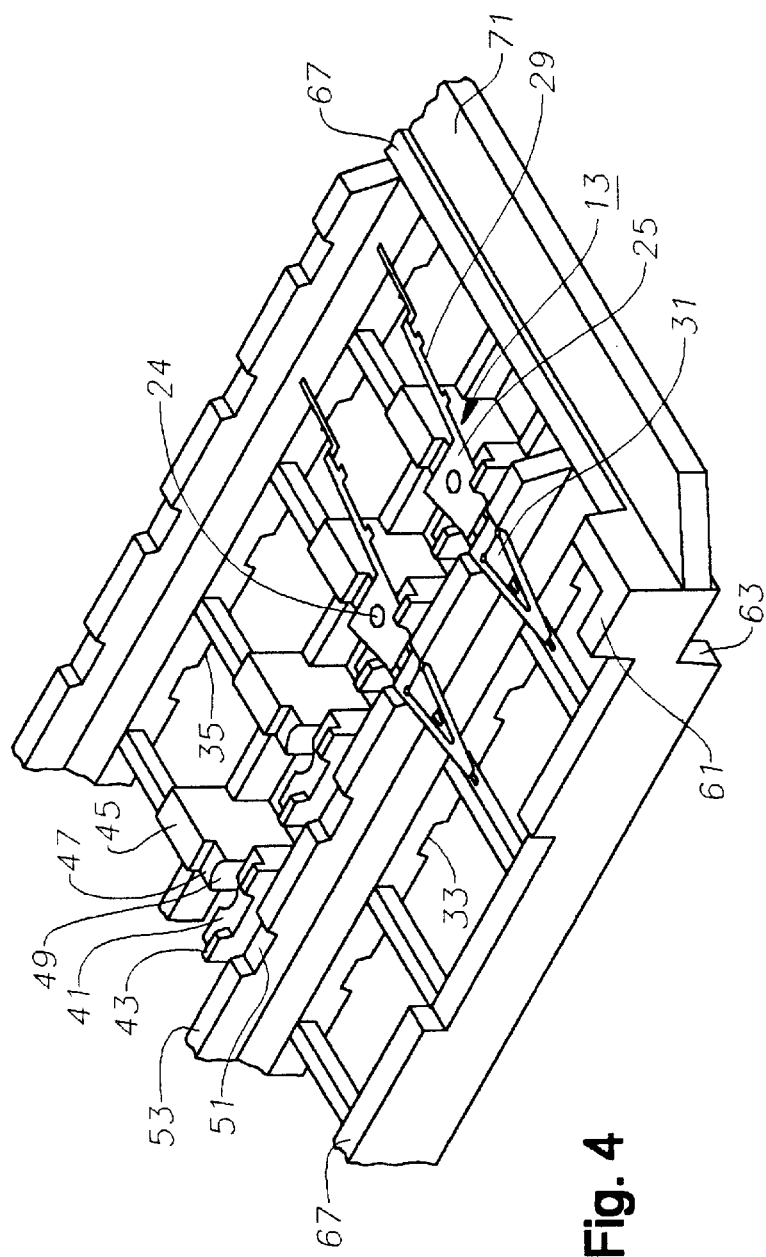

SHIPPING TRAY BACKSIDE LOCATION

TECHNICAL FIELD

This invention relates in general to trays for handling small components, and in particular to a tray for processing and inspecting suspensions or head gimbal assemblies.

BACKGROUND ART

Integrated lead suspensions (ILS) for computer hard disk drive head gimbal assemblies (HGA) differ from prior art suspension designs as they have electrical leads which are an integral part of the suspension. Integrated leads allow the assembly to have smaller suspension geometries than its predecessors. HGAs are generally flat, triangular-shaped devices with at least one magnetic read/write head or slider mounted to it. HGAs have two sides or surfaces and may be processed in a "slider up" or "slider down" orientation. One problem encountered with HGAs during manufacturing is that the smaller geometries require careful handling and very precise positioning of the suspension and the sliders when they are mechanically and electrically connected during assembly.

Commonly, HGAs and the weldments or suspensions they are made from are processed or handled in an injection molded tray. The trays have features which retain a large number of the HGAs in one orientation. However, in some circumstances it is necessary to process or inspect HGAs in a tray out of the normal orientation. In addition, it is sometimes necessary to transfer all HGAs from one tray to another if the original tray is damaged. An improved tray for handling and manipulating HGAs is needed.

DISCLOSURE OF THE INVENTION

A tray used during the processing and handling of HGAs has a set of locating and support features on both its top and bottom surfaces. Each tray has a perimeter which is designed to engage and be stacked above or below other ones of the trays. When the trays are stacked one on top of another, they nest so that the features on a top side of each of the trays do not interfere with the features on a bottom side of the adjacent trays. Thus, a stack of trays can be turned over and the HGAs that are located in the top sides will drop down and instantly be located in the bottom sides of the trays adjacent to them.

BRIEF DESCRIPTION OF THE DRAWINGS

FIG. 3 is an end view of the tray of FIG. 1.

FIG. 4 is an enlarged bottom isometric view of the tray of FIG. 1.

BEST MODE FOR CARRYING OUT THE INVENTION

Figure 1:
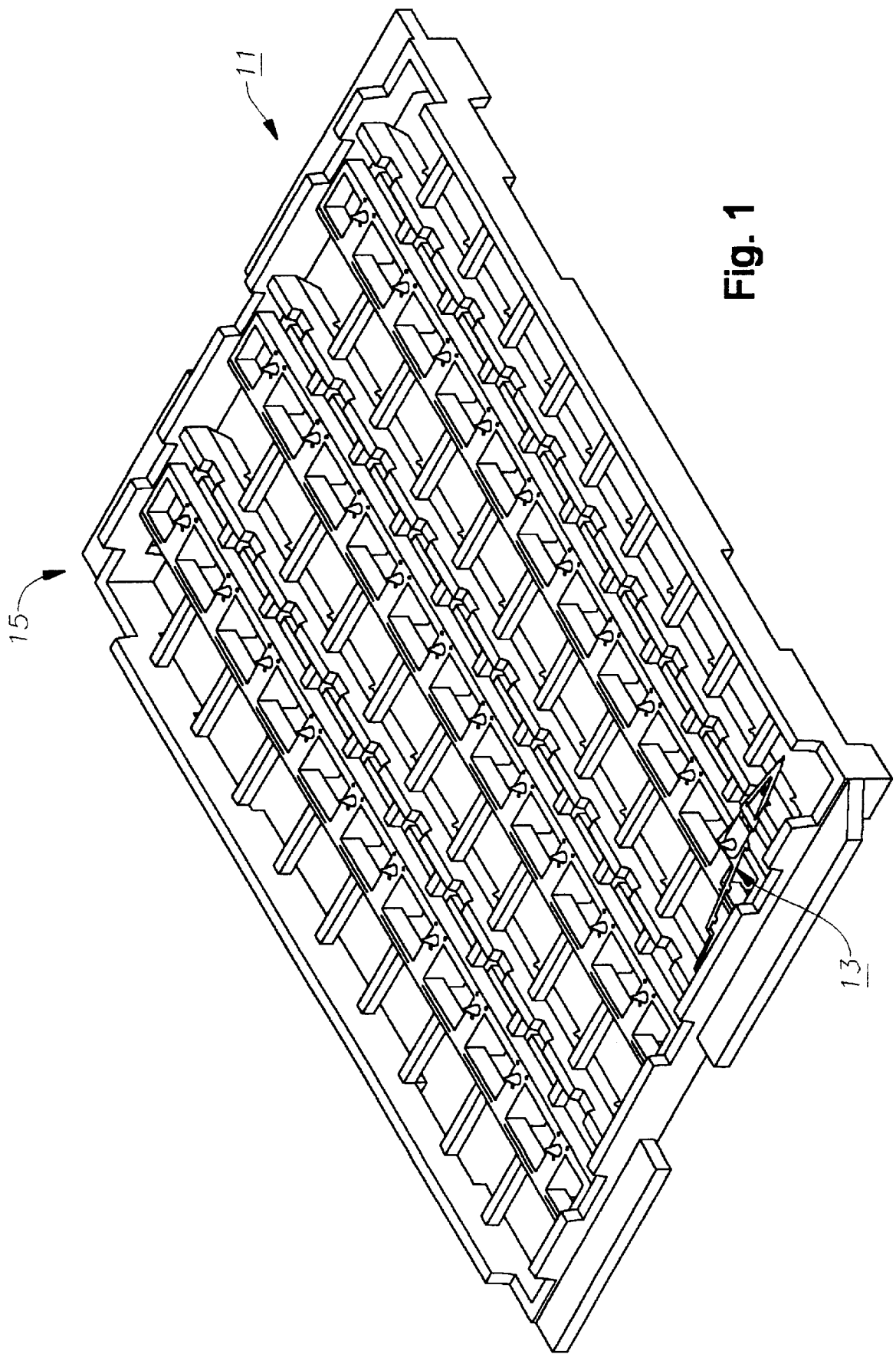
FIG. 1 is a top isometric view of a tray constructed in accordance with the invention.
Figure 2:
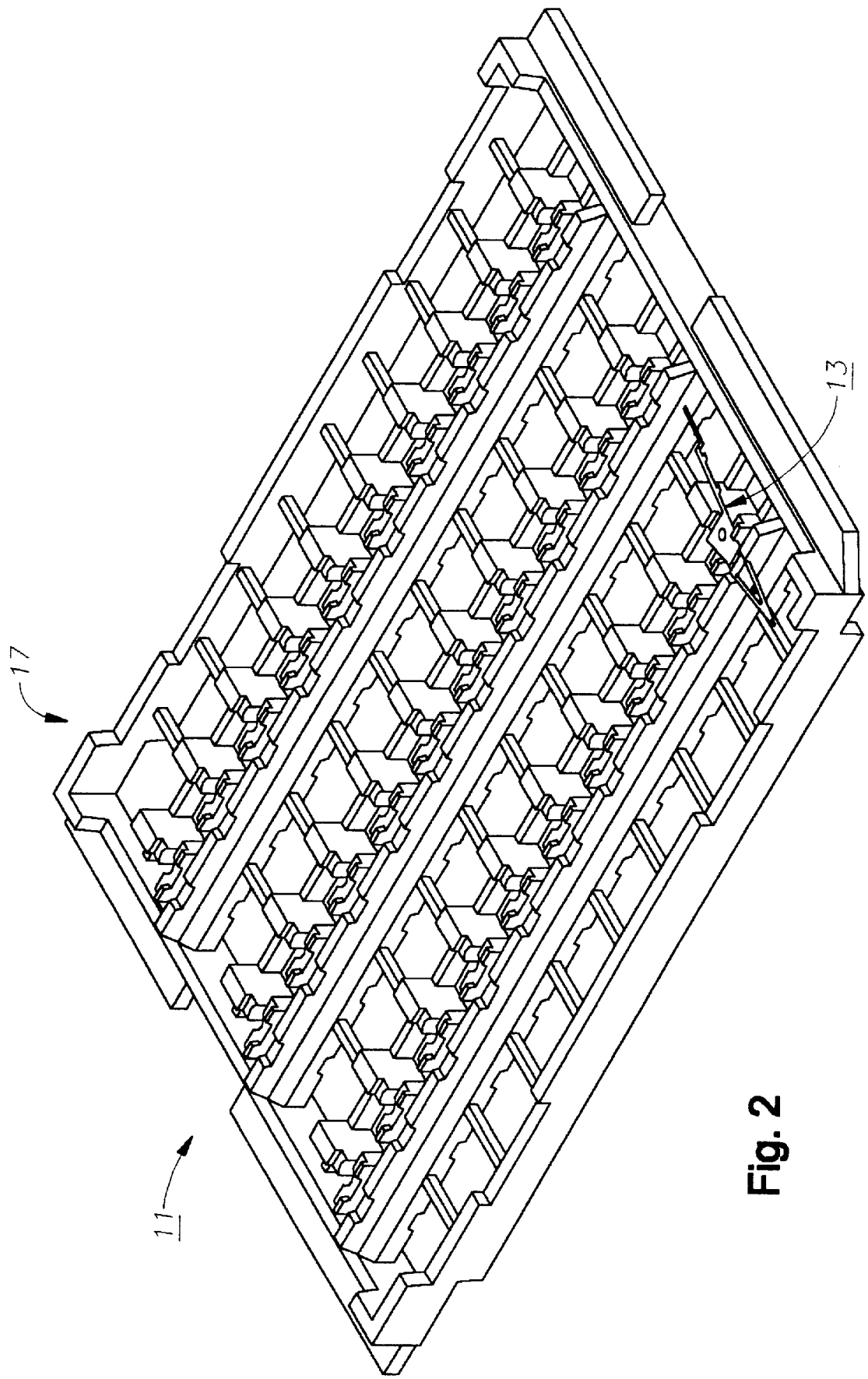
FIG. 2 is a bottom isometric view of the tray of FIG. 1.

Referring to FIGS. 1 and 2, a generally rectangular tray 11 for handling a plurality of bent lead head gimbal assemblies (HGAs) 13 is shown. Tray 11 is formed from an insulating material to protect HGAs 13 from electrostatic discharge. Tray 11 has two primary surface or sides: a top 15 and a bottom 17. Top 15 and bottom 17 each have unique features which are specially configured to handle HGAs in one orientation. Top 15 (FIG. 1) is designed for a slider down orientation, while bottom 17 (FIG. 2) is designed for a slider up orientation. In the embodiment shown, top 15 and bottom 17 each have a three-by-ten array of thirty positions for HGAs 13.

Figure 5:
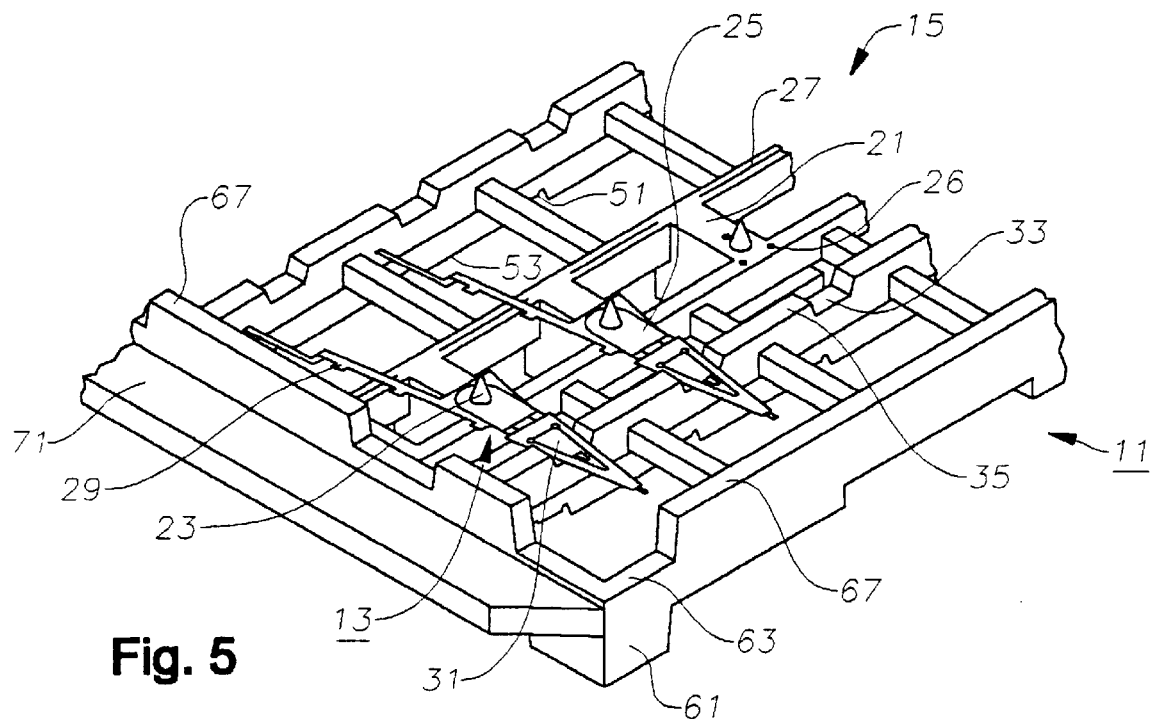
FIG. 5 is an enlarged top isometric view of the tray of FIG. 1.

As shown in FIG. 5, each position on top 15 has an inverted T-shaped platform 21 with a short locating pin 23 extending perpendicularly therefrom. Each platform 21 supports a main body 25 of one HGA 13. Locating pins 23 are the primary locating features for HGAs 13 on top 15, and are provided for extending through a central hole 24 (FIG. 4) in body 25. In the embodiment shown, each platform 21 has three standoffs 26 surrounding locating pin 23. A raised bar 27 extends laterally from each platform 21 for supporting a tailstock 29 of one HGA 13. A forward portion 31 of each HGA 13 is nested in and supported by a tapered notch 33 in a lateral rib 35. Notches 33 are spaced apart from a forward end of platform 21 and are contoured to the shape of forward portion 31. Thus, when an HGA 13 is mounted on a locating pin 23 on top 15, its tailstock 29, body 25 and forward portion 31 make contact with bar 27, platform 21 and notch 33, respectively. Locating pins 23 and notches 33 substantially restrict HGAs 13 vertical movement. These features are repeated at each position on top 15. Referring now to FIGS. 3 and 4, each position on bottom 17 has a central support platform 41 with a pair of vertical tabs 43. Each central support platform 41 supports the body 25 of one HGA 13. A rear support block 45 is spaced apart from a rearward end of platform 41. Block 45 has a shelf 47 for supporting a rearward end of body 25. A generally circular recess 49 separates block 45 and platform 41. As will be explained below, recesses 49 are provided for accommodating locating pins 23. The forward portion 31 of each HGA 13 is nested in and supported by a tapered notch 51 in a lateral rib 53. Notches 51 are spaced apart from a forward end of platform 41 and are contoured to the shape of forward portion 31. Tailstocks 29 are not directly supported on bottoms 17. Thus, when an HGA 13 is located on bottom 17, its body 25 makes contact with platform 41 and shelf 47, and its forward portion 31 makes contact with notch 51. Notches 51, tabs 43 and block 45 substantially restrict HGAs 13 to vertical movement. These features are repeated at each position on bottom 17.

Figure 6:
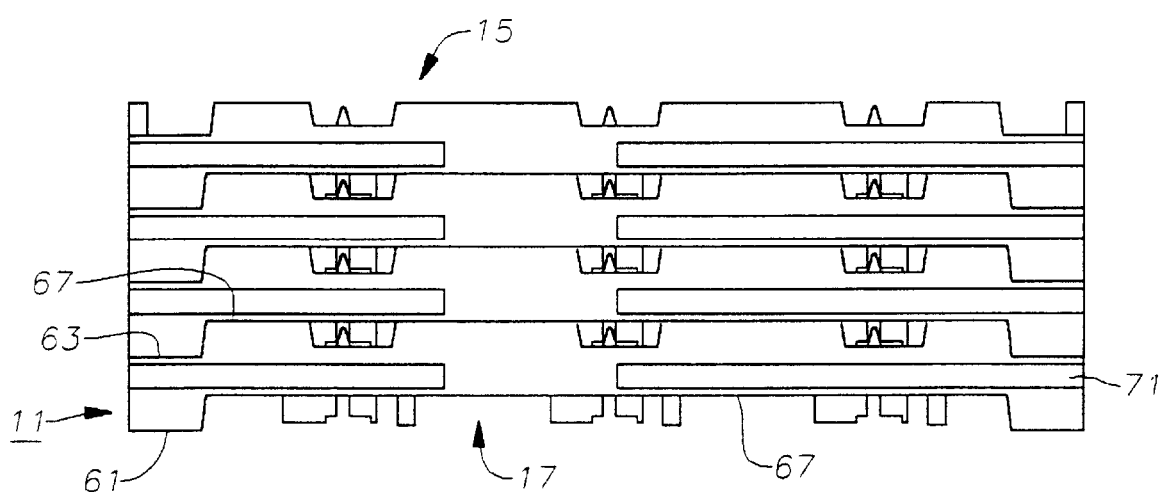
FIG. 6 is an end view of a stacked plurality of the trays of FIG. 1.
Figure 7:
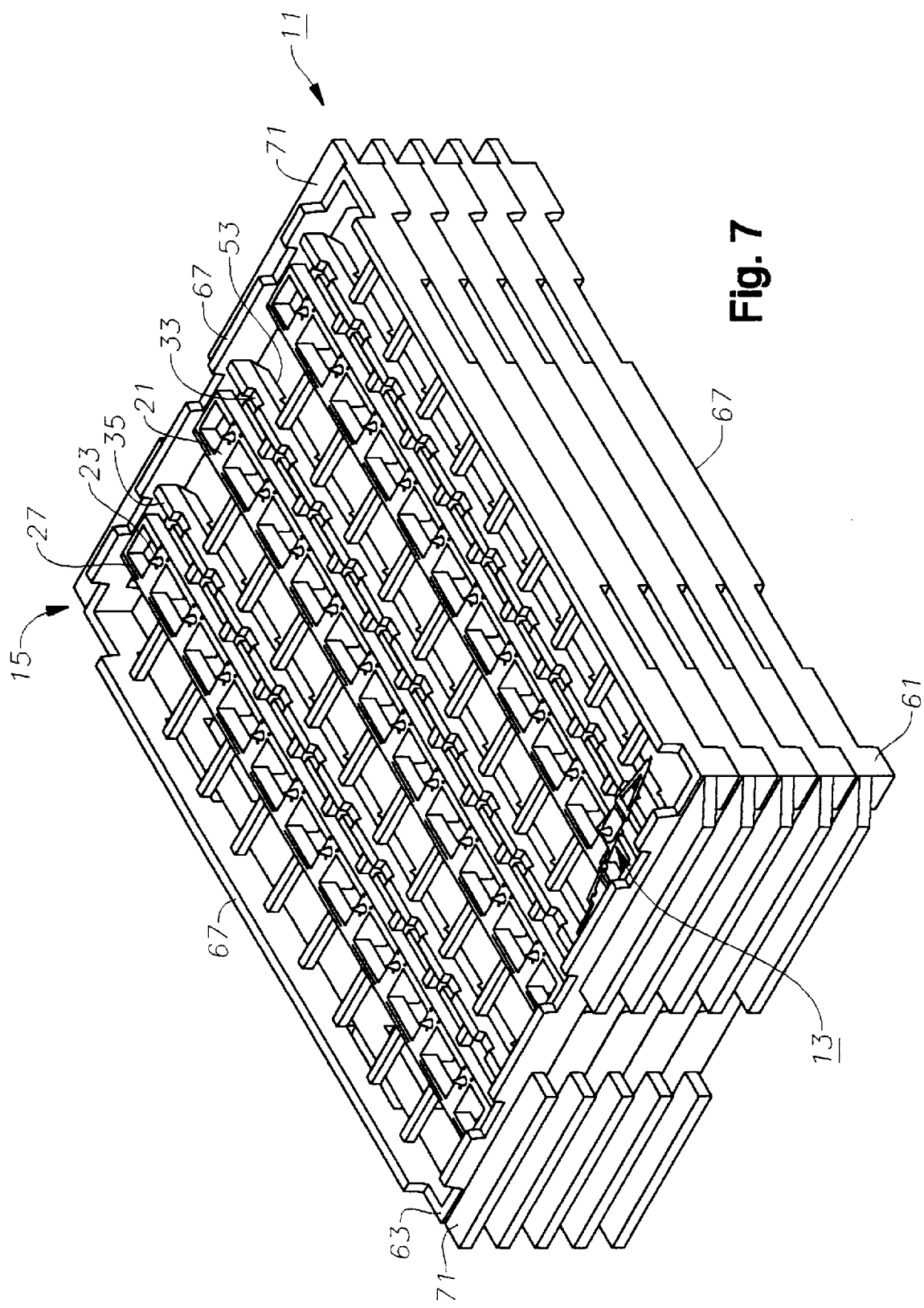
FIG. 7 is a top isometric view of a stacked plurality of the trays of FIG. 1.

As shown in FIGS. 6 and 7, trays 11 are designed to be stacked on top of each other. The perimeters of tops 15 and bottoms 17 have profiles which facilitate stacking. Each corner of bottom 17 has an L-shaped castellation 61 (FIG. 4) which seats in an L-shaped notch 63 (FIG. 5) on an adjacent top 15. When the bottom 17 of a first tray 11 is placed on the top 15 of a second tray 11, the four corner castellations 61 on the first tray 11 will extend into the four corner notches 63 on the second tray 11. The matched profiles of trays 11 allow their perimeter walls 67 to mount flush against each other. Each tray 11 also has a plurality of handles 71 for a better grip.

In operation, an HGA 13 is placed in a position on tray 11. The HGA may be placed on either top 15 or bottom 17, but only one side can be populated at any time. During use, either top 15 or bottom 17 can hold up to thirty HGAs 13. When another tray 11 is nested on top of the populated tray 11, the trays can be flipped over or inverted 180 degrees to reorient the HGAs 13 without having to manipulate them.

For example, the top 15 of a tray 11 is filled with HGAs 13. As described previously, each HGA 13 is nested in one position in the slider down orientation. The bottom 17 of a second tray 11 is nested on top 15 of the populated tray 11. When the trays 11 are joined, the locating features of top 15 are so close to the locating features of bottom 17 that the HGAs 13 are trapped therebetween. More specifically, block 45 and tabs 43 substantially land on platform 21, and ribs 35, 53 very nearly abut one another. The HGAs 13 are incapable of being dislodged from their positions when trays 11 are joined. The small clearances between the locating features of each tray 11 allow them to be flipped over to move HGAs 13 to the previously unpopulated tray and reverse them to the slider up orientation. As shown in FIG. 7, any number of trays 11 may be stacked together and each tray 11 can have from zero to thirty HGAs.

The invention has several advantages. The trays allow HGAs to be processed and inspected in both the slider up and the slider down orientations by providing a second set of locating features on the bottom or back side of the trays. HGAs can also be transferred from tray to tray using these back side locating features along with the top side locating features of a mating tray. The locating features do not interfere with each other when the trays are nested and prevent the HGAs from dislodging.

While the invention has been shown or described in only one of its forms, it should be apparent to those skilled in the art that it is not so limited, but is susceptible to various changes without departing from the scope of the invention.

I claim:

1. An apparatus for handling workpieces, comprising:

a first tray having a first side which has at least one locating profile and is adapted to retain a workpiece in a first orientation;

a second tray having a second side which has at least one locating profile and is adapted to retain the workpiece in a second orientation; wherein the first side of the first tray is adapted to engage and substantially abut the second side of the second tray such that, when the trays are abutted and inverted, a workpiece located therebetween transfers from the locating profile of one of the trays to the locating profile of the other of the trays and the orientation of the workpiece is reversed; and wherein the locating profile on the first side has a platform for supporting a body of the workpiece, a locating pin for reception within a hole provided in the locating profile of the second side, and a recess for receiving another portion of the workpiece for restricting its lateral movement.

2. The apparatus of claim 1 wherein each of the trays has both a first side and a second side located opposite the first side, each of the sides having at least one of the locating profiles.

3. The apparatus of claim 1 wherein said at least one locating profile on the first and second sides comprises a plurality of the locating profiles on each of the sides.

4. The apparatus of claim 1 wherein at least a portion of the locating profile of the first side is adapted to substantially abut the locating profile of the second side when the trays are engaged.

5. The apparatus of claim 1 wherein the trays are formed from an insulating material.

* * * * *